(12) United States Patent
Rotondaro et al.

(10) Patent No.: US 6,835,639 B2
(45) Date of Patent: Dec. 28, 2004

(54) MULTIPLE WORK FUNCTION GATES

(75) Inventors: Antonio L. P. Rotondaro, Dallas, TX (US); Mark R. Visokay, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/302,212

(22) Filed: Nov. 22, 2002

(65) Prior Publication Data

US 2003/0109121 A1 Jun. 12, 2003

Related U.S. Application Data

(60) Provisional application No. 60/334,459, filed on Nov. 30, 2001.

(51) Int. Cl.[7] ............... H01L 21/3205; H01L 21/4763; H01L 21/44
(52) U.S. Cl. .................. 438/592; 438/585; 438/682
(58) Field of Search .................. 438/592, 585, 438/682, 241, 197, 221, 430

(56) References Cited

U.S. PATENT DOCUMENTS

| | | | |
|---|---|---|---|
| 4,812,889 A | * 3/1989 | Kakumu ................. 257/407 |
| 5,242,847 A | 9/1993 | Ozturk et al. |
| 5,691,561 A | * 11/1997 | Goto ..................... 257/369 |
| 6,187,617 B1 | * 2/2001 | Gauthier et al. ........... 438/197 |
| 6,204,103 B1 | 3/2001 | Bai et al. |
| 6,214,679 B1 | 4/2001 | Murthy et al. |
| 6,242,311 B1 | * 6/2001 | Ahn ..................... 438/275 |
| 6,252,283 B1 | 6/2001 | Gardner et al. |
| 6,333,222 B1 | * 12/2001 | Kitazawa et al. ........ 438/241 |
| 6,562,718 B1 | * 5/2003 | Xiang et al. ........... 438/682 |
| 6,667,204 B2 | * 12/2003 | Kim ..................... 438/221 |
| 2001/0028093 A1 | 6/2001 | Gardner et al. |

* cited by examiner

*Primary Examiner*—John F. Niebling
*Assistant Examiner*—Walter L. Lindsay, Jr.
(74) *Attorney, Agent, or Firm*—Carlton H. Hoel; W. James Brady; Frederick J. Telecky, Jr.

(57) ABSTRACT

A method of forming a first and second transistors with differing work function gates by differing metals deposited to react with a silicon or silicon-germanium gate layer.

5 Claims, 5 Drawing Sheets

MULTIPLE WORK FUNCTION GATES

CROSS-REFERENCES TO RELATED APPLICATIONS

This application claims priority from the following provisional patent applications Ser. Nos. 60/334,459, filed Nov. 30, 2001.

BACKGROUND OF THE INVENTION

The present invention relates to semiconductor transistor fabrication and are more particularly to complementary transistors and integrated circuits containing them.

Integrated circuit technology continues to advance at a rapid pace, with many circuit technologies being implemented using semiconductor fabrication processes. With the advancement of semiconductor circuit fabrication methods, consideration is given to various aspects, including maximizing efficiency, lowering manufacturing cost, and increasing performance. With these goals in mind, one area is the continuing trend of reducing the thickness of the transistor gate dielectrics. For example, in the past the gate dielectric (e.g., silicon dioxide or nitrided silicon dioxide) layer thickness was on the order of 10 nm, but more recently that thickness has reduced considerably with a more current goal being on the order of 2 nm. Indeed, this goal will strive for even thinner gate dielectric layers in the foreseeable future. This goal reduces device size and facilitates improved device performance.

While the desirability and trend toward thinner gate dielectrics continues, such an approach also provides a considerable drawback. Specifically, overlying the thin gate dielectric is a polycrystalline silicon ("polysilicon") gate layer, and polysilicon naturally includes a depletion region at the interface between the polysilicon gate and the gate dielectric. Typically, the depletion region manifests itself as providing the electrical equivalent of approximately a 0.3 nm thick insulator and, as such, the region in effect provides an insulating effect rather than a conducting effect as would be present in the remainder of the polysilicon gate conductor. Using the preceding numeric example, therefore, for a 10-nm thick gate dielectric, then the overlying effective 0.3-nm thick polysilicon depletion region may be thought to effectively increase the overall insulation between the gate and the underlying transistor channel from 10 nm to 10.3 nm, that is, the effect of the depletion region affects the insulating thickness by three percent—as such, for previous thicker gate insulators the effect of the polysilicon depletion region may be considered to have a negligible impact on the gate dielectric. In contrast, however, for a 2-nm thick gate dielectric, the polysilicon gate conductor depletion region may be thought to increase the gate insulator to 2.3 nm, thereby representing an increase on the order of 15 percent. This increased percentage significantly reduces the benefits otherwise provided by the thinner gate dielectric.

One approach in general to avoiding the depletion region phenomenon of polysilicon transistor gates is to use metal as an alternative material for the transistor gate because metal does not present a considerable depletion region, if any. Prior to the more recent use of polysilicon gates, metal gates were fairly common. However, a previously-identified drawback of such metal gates, which indeed led to the avoidance of such metals in contemporary devices, is that each metal has a corresponding so-called work function, and in the transistor art each transistor also has a corresponding preferred value for a work function of the gate electrode. However, the desired work function value differs for different transistor types. For example, based on present day threshold voltage channel doping, a p-channel MOS transistor ("PMOS") is optimized when the gate electrode has a work function on the order of 5 eV; while an n-channel MOS transistor ("NMOS") is optimized when the gate electrode has a work function on the order of 4 eV. The problem with previously-used metal gates arose with the development of CMOS circuits which, by definition, include both PMOS and NMOS transistors. Specifically, because a metal gate provides only a single work function, then it could not be selected to provide the two different desired work functions of the PMOS and NMOS devices. Instead, at best a metal could be selected to be between the desired work function of a PMOS and an NMOS transistor, which is sometimes referred to as the "midgap" between these devices (i.e., on the order of 4.5 eV for the preceding examples). This inability to match different work functions led to the use of polysilicon gates whereby the polysilicon gates of the NMOS devices could be doped in a first manner in view of the desired work function for NMOS transistors and the polysilicon gates of the PMOS devices could be doped in a second manner in view of the desired work function for PMOS transistors.

More recent approaches have used two different metals for gates. For example, U.S. Pat. No. 6,265,258 deposits a tantalum metal gate layer (work function about 4.2 eV) and then selectively nitrides the portion over the PMOS areas to form tantalum nitride gates (work function about 5.4 eV) while the NMOS gates remain tantalum. Similarly, U.S. Pat. No. 6,204,103 deposits polysilicon and over the NMOS areas deposits titanium and over the PMOS areas deposits molybdenum; then an anneal simultaneously forms titanium silicide gates for NMOS and molybdenum silicide gates for PMOS.

However, the foregoing two metal or silicide gate approaches have processing drawbacks including silicide interface discontinuities.

SUMMARY OF THE INVENTION

The present invention provides a method of forming first and second transistor gate electrodes comprising metal-germano-silicides with differing materials for NMOS and PMOS in CMOS integrated circuits. Preferred embodiments employ a two-step silicidation.

This has advantages including simple processing for enhanced performance of CMOS integrated circuit devices.

DETAILED DESCRIPTION OF THE PREFERRED EMBODIMENTS

FIGS. 1–9 illustrate in cross-sectional elevation views steps of a first preferred embodiment method of CMOS fabrication. Preferred embodiment methods and CMOS structures replace the n- and p-type polysilicon gate electrodes with metal-silicide gate electrodes. This has advantages including lower gate resistance, eliminated dopant diffusion problems and prevention of gate electrode depletion effects of doped (poly)silicon gate electrodes. In fact, the preferred embodiment silicide gate electrodes may be used with either high-k gate dielectrics or with known silicon dioxide and silicon oxynitride gate dielectrics or other gate dielectrics. The preferred embodiments maintain the work function of the gate electrode material to approximately equal that of the underlying silicon channel region. Thus NMOS gate electrodes should have a work function approaching 4.0–4.2 eV which is the work function of n+ silicon, and PMOS gate electrodes should have a work function approaching 5.0–5.2 eV which is the work function of p+ silicon.

The first preferred embodiment employs silicide gate electrodes with tantalum silicide ($TaSi_2$) for the NMOS gate electrode and palladium silicide ($Pd_2Si$) for the PMOS gate electrode. $TaSi_2$ has a work function of 4.2 eV and $Pd_2Si$ has a work function of 5.1 eV. The first preferred embodiment method fabricates such gates as illustrated in FIGS. 1–9. Note that FIGS. 1–9 illustrate in cross-sectional elevation view a semiconductor structure but with only a single PMOS and a single NMOS transistor for clarity; in a single integrated circuit there may be tens of millions of NMOS and PMOS transistors. Also the various layers shown in the Figures are not shown to scale to simplify the following discussion and because varying thickness may be employed.

Figure 1:
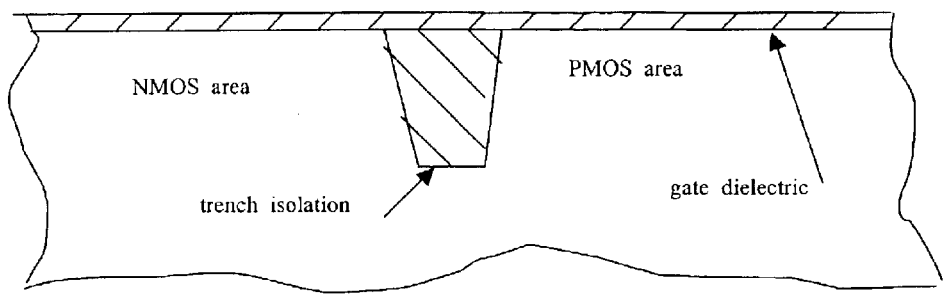
FIGS. 1–9 illustrate in cross-sectional elevation views steps of a first preferred embodiment method of fabrication.

Turning to FIG. 1, the first preferred embodiment begins with a semiconductor surface formed preferably by a substrate that is preferably formed from silicon with shallow trench isolation (trench depth such as 300 nm). Various dopant implantations into the silicon substrate to define wells, channel stops, punch-through suppression, and threshold voltages may be performed separately for the NMOS and PMOS areas. A gate dielectric layer is formed over the substrate, where the material for the dielectric layer is preferably chosen so that portions of the dielectric layer later function as gate dielectrics for complementary PMOS and NMOS transistors. The gate dielectric of thickness such as 2–10 nm may be a high-k dielectric such as $HfSiO_4$ with various Hf to Si ratios to ensure amorphicity or silicon dioxide or oxynitrides, SiON, or other materials which will be stable in contact with silicon and the metal silicides to be formed.

Figure 2:
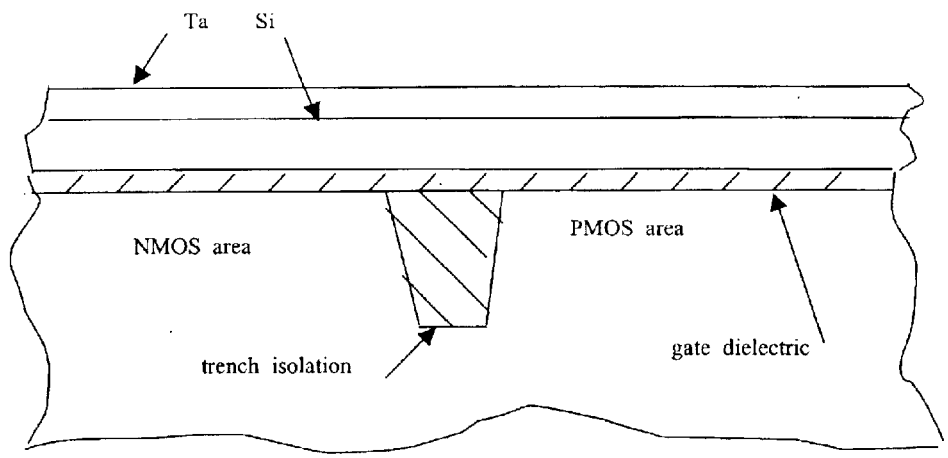

FIG. 2 shows a silicon layer formed on the gate dielectric layer. In the preferred embodiment, the silicon layer may be polysilicon or amorphous silicon and of thickness 100 nm. As between these alternatives, preferably the selection is such that, at the stage in the process, the chosen silicon layer does not react with the underlying gate dielectric layer and the thermal budget is minimized to prevent any recrystallization of an amorphous gate dielectric layer when a high-k dielectric is used. Given these considerations, in most applications amorphous silicon will be used because it may be formed over the gate dielectric layer at lower temperatures than that typically required to form polysilicon. Moreover, the use of an amorphous silicon layer avoids grain boundaries, which may affect subsequent silicidation. For example, an amorphous silicon layer may be formed at temperatures lower than 500° C. Note also that the manner in which the silicon layer is formed may be according to various alternatives, again where the choice of such an alternative is preferably directed to ensuring lower thermal budget. For example, a sputter technique may be used because it may be carried out at low temperatures such as room temperature, although from a manufacturing standpoint such a technique may prove relatively complex. As an alternative, a plasma-enhanced chemical vapor deposition ("PECVD") may be used because it too uses a relatively low temperature, where this temperature may be above room temperature yet the PECVD may prove more easily implemented as compared to the sputter technique. Lastly, a thermal CVD process may be used, but caution should be taken to ensure that any temperature constraint of that process does not cause a reaction between the gate dielectric layer and the silicon layer.

A layer of a first metal ("metal 1") is deposited on the amorphous silicon-coated substrate. In the case of the first preferred embodiment, the metal 1 layer is composed of tantalum and has a thickness of about 46 nm; this amount of Ta will react with the 100 nm of Si to form roughly stoichiometric silicide by the reaction $Ta+2Si \rightarrow TaSi_2$ and with a resulting silicide layer thickness of about 108 nm. Sputtering can preferentially perform the deposition but this can also be done by another physical vapor deposition (PVD) method or by CVD. Metal 1 deposition might be preceded by a surface preparation of the silicon surface to ensure that the metal 1 and the silicon surface are in intimate contact. For instance, a diluted HF treatment of the silicon surface can be used prior to metal 1 deposition to remove any native oxide from the silicon surface. Metal 1 deposition (as well as metal 2 deposition later on) should be done at low enough temperatures so as to avoid reaction with the Si layer below it.

Figure 3:
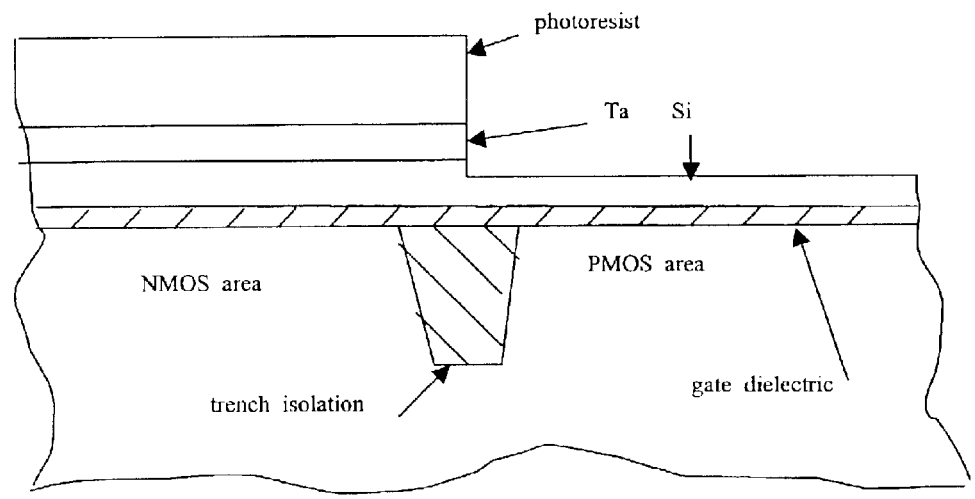

FIG. 3 illustrates in cross-sectional elevation view the structure from FIG. 2 after a portion of the metal 1 layer has been removed, thereby leaving a remaining portion of metal 1. In the preferred embodiment, this selective removal is achieved by first forming a photoresist layer over the metal 1 layer and then patterning that photoresist layer to leave a photoresist portion of the photoresist layer. Thereafter, an etch selective to the silicon is performed, that is, one which effectively stops when it reaches the silicon layer. In the preferred embodiment, therefore, the metal 1 etch performed in connection with FIG. 3 is selective to amorphous silicon. The selective etch removes the area of the metal 1 layer that is not covered by photoresist, thereby leaving a remaining metal 1 portion under the photoresist. In the first preferred embodiment the etch of metal 1 (tantalum) is a dry (plasma) process, although alternatively a wet etch may be implemented because the result of the etch does not provide critical dimensions in that a later etch is performed to provide various device boundaries as further appreciated below. In the case of dry etch, a fluorine-based etchant could be used as $TaF_5$ is quite volatile. End point detection for this plasma etch would be the presence of $SiF_4$ in the etch products, and overetching which removes some silicon is not a significant problem. Indeed, a loss of 10% of the silicon (down to 90 nm) still yields ample silicon for the PMOS area silicidation.

Figure 4:
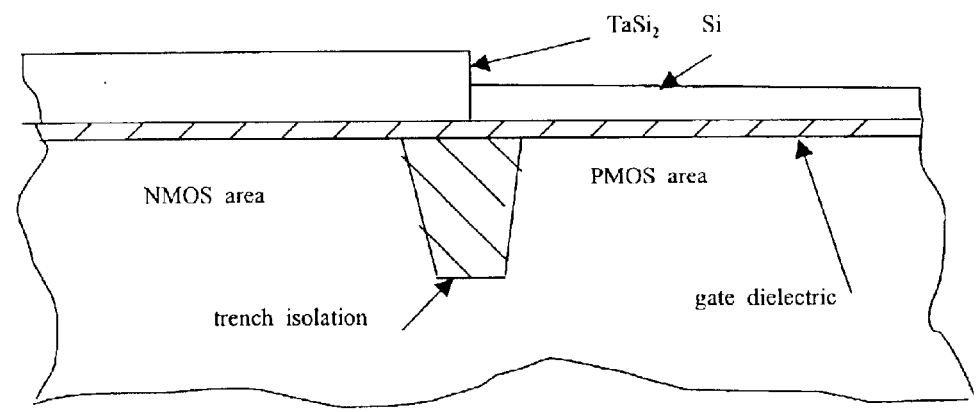

FIG. 4 illustrates in cross-sectional elevation view the structure from FIG. 3 after the following two additional processing steps.

As a first step reflected in FIG. 4, the photoresist (see FIG. 3) is removed, and this removal step may be accomplished in various manners. For example, either an oxygen or hydrogen ash may be used, although an oxygen approach is less favored because it may pose a risk of oxidation of the metal 1 (tantalum) and the exposed area of the silicon layer. As still another example, a solvent may be chosen, in which case the particular solvent should be selected so as not to damage either the metal 1 underlying the photoresist or the silicon in the exposed area. In any event, once the photoresist is removed, the metal 1 is exposed.

As a second step reflected in FIG. 4, an anneal step is performed preferably after the photoresist is removed. The anneal step may be achieved using various atmospheres, temperatures and times, and by way of example a rapid thermal processing ("RTP") operation may be used whereby a relatively short anneal is performed at temperatures of 500° C. or greater in a low pressure (5 Pa) inert (argon) atmosphere. In the first preferred embodiment, the anneal causes the metal 1 to react with the aligned portion of the silicon underlying it, and this reaction thereby forms a metal-1 silicide. The actual temperature used in the anneal step as well as the specific ratio of the thicknesses of the metal and silicon may determine the precise type of silicide. For example, using the first preferred embodiment tantalum for metal 1, then tantalum monosilicide or tantalum disilicide can be formed. Indeed, in various applications, the tantalum disilicide result may be desirable because it has a lower resistivity as compared to tantalum monosilicide. In addition, note also from FIG. 3 and the result in FIG. 4 that the thickness of the metal 1 layer, which determines the thickness of the remaining metal 1 portion, also may affect the extent to which the metal 1 is converted to a silicide. Further in this regard, in an alternative approach, the thickness of the metal 1 layer may be selected so as to achieve a desired extent and thickness of silicide in the formed silicide portion. However, thickness control may prove difficult, but in view of this added complexity still another alternative approach within the preferred embodiment scope is to choose the thickness of the metal 1 layer to be considerably larger than required for stoichiometry with the goal that not all of the metal 1 will be consumed during the anneal step. Using this approach, then after the anneal a portion of the structure is etched, such as through use of a blanket metal 1 etch, so as to remove the unconsumed metal 1. This can be a wet or dry etch. With the unconsumed metal 1 removed, the formed metal-1 silicide portion remains as shown in FIG. 4. Lastly, note that the preferred embodiment anneal step does not materially affect the portion of unreacted silicon layer to the right in FIG. 4 because it was not in contact with any metal 1 as shown in FIG. 3. Thus, this portion remains as the material originally deposited (e.g., silicon).

Figure 5:
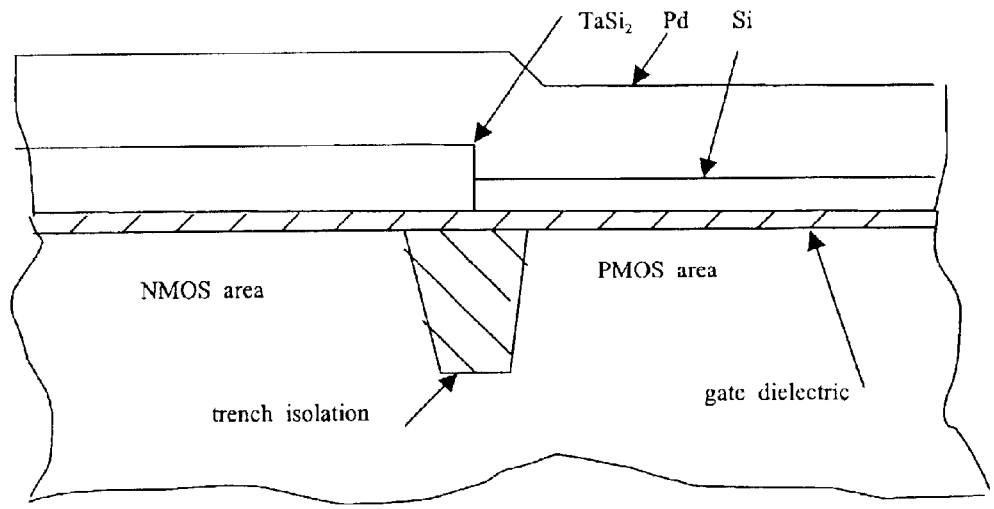
Figure 6:
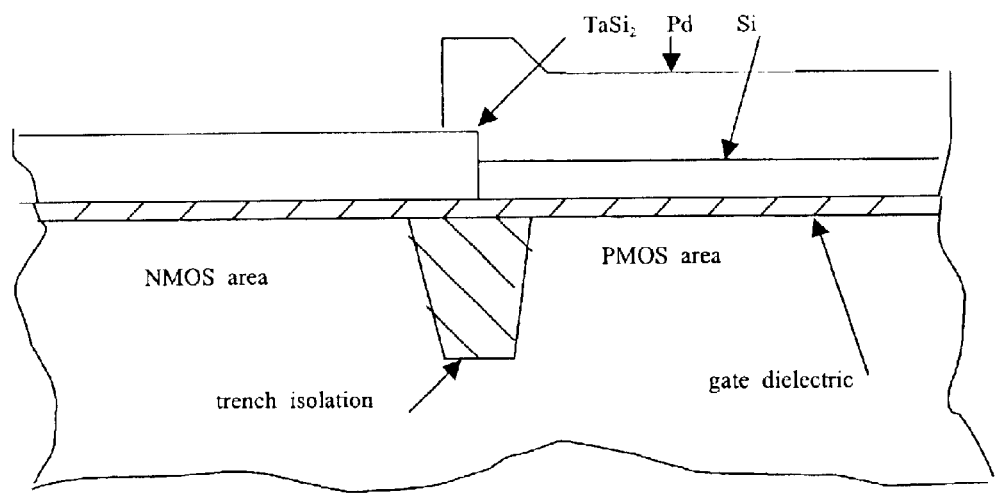
Figure 7:
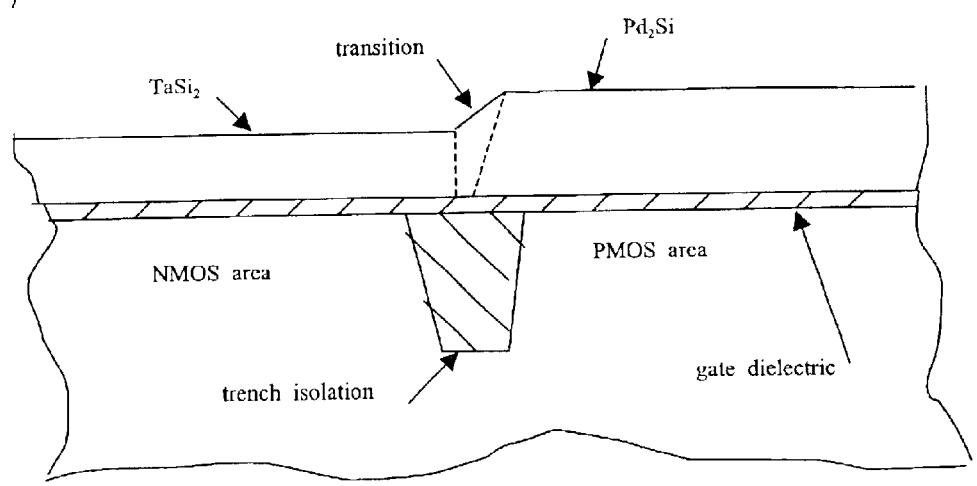

FIGS. 5–7 illustrate the next steps of: repeat silicon surface preparation (e.g., HF dip), deposit metal 2, pattern photoresist, etch metal 2, and silicidation reaction of metal 2 and silicon over PMOS areas.

As shown in FIG. 5, deposit metal 2 (palladium) on the substrate which has the metal-1 silicide over NMOS areas and amorphous silicon over PMOS areas. Similar to the case of the metal 1 deposition, sputtering can preferentially perform the deposition but this can also be done by another physical vapor deposition (PVD) method or by metalorganic CVD. In the case of the first preferred embodiment, metal-1 silicide is tantalum disilicide and metal 2 is palladium. The palladium may have a thickness of about 130 nm; this will consume the roughly 90 nm of silicon remaining over the PMOS areas in a reaction such as

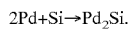

FIG. 6 shows the substrate after photoresist patterning the PMOS areas and etching the exposed portion of metal 2 over the NMOS areas. Note an overlap of the pattern to insure metal 2 contacts metal 1 silicide. In the case of dry etch, a chlorine based etchant could be used as $PdCl_2$ is somewhat volatile, but requires a low pressure process. End point detection for this plasma etch would be the presence of $SiCl_4$ ($TaCl_4$ can be used as well) in the etch products. Trace amounts of residual palladium on the tantalum silicide will not significantly affect the NMOS gates.

A silicidation anneal converts the metal 2 on the silicon over PMOS areas into metal 2 silicide; see FIG. 7 showing $TaSi_2$ over the NMOS areas and $Pd_2Si$ over the PMOS areas with some transition at the junction of the two silicides over the shallow trench isolation areas. The Pd overlap on the $TaSi_2$ insures sufficient Pd to totally bond all of the silicon in the transition from $TaSi_2$ to $Pd_2Si$, so no voids or silicon precipitates form and this insures low resistivity connection in the gate-level interconnects. Indeed, Pd is more electronegative (less reactive) than Ta, so the Pd does not reduce the $TaSi_2$ (or TaSi) during the silicidation anneal; that is, the heat of formation of the Ta silicide is larger than that of the Pd silicide. Contrarily, if the $Pd_2Si$ had been formed first (or the silicidations had been simultaneous), then the Ta silicidation reaction likely would have reduced $Pd_2Si$ in the transition region and formed precipitates or voids.

Figure 8:
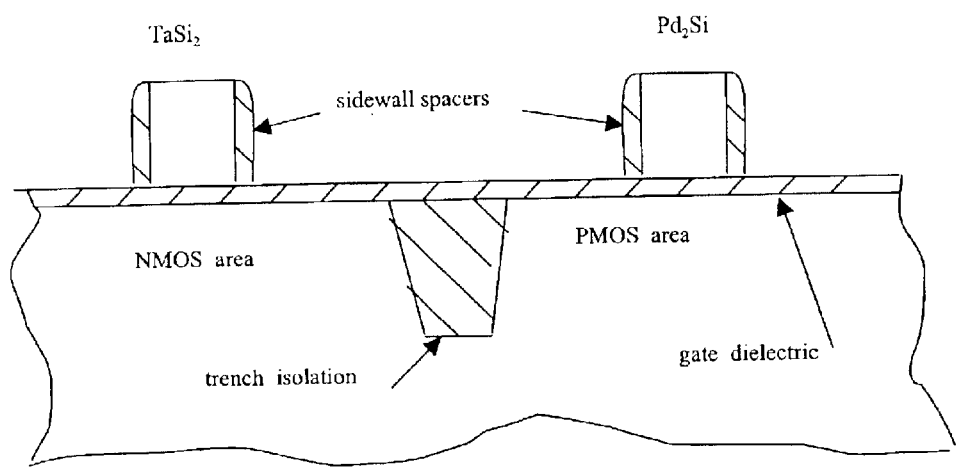

FIG. 8 illustrates the results of a gate etch of the metal silicides plus subsequent sidewall spacer formation. In particular, first, a photoresist layer is formed and patterned over the structure of FIG. 7 to thereby form photoresist portions overlying the metal-1 silicide and metal-2 silicide materials and defining locations of the NMOS and PMOS gates plus interconnections at the gate level. Second, an etch of the metal silicides is performed down to the dielectric layer. The etch may be in two stages with an initial etch using a high-density plasma including fluorine followed by a second etch using a plasma containing chlorine. The initial fluorine etch rapidly removes the bulk of the $TaSi_2$ and $Pd_2Si$, and the chlorine etch completes silicide removal plus effectively stops on the dielectric and allows overetching of the silicides. The resulting structures following this etch are shown in FIG. 8 and include two gate electrodes. With respect to the first gate electrode, it includes a metal-1 silicide portion which remains from the etch of the metal-1 silicide layer, and a portion of dielectric layer that separates the metal-1 silicide from the substrate, and this portion serves as a gate dielectric. With respect to the second gate electrode, it includes a metal-2 silicide portion which remains from the etch of the metal-2 silicide, and a portion of dielectric layer that separates the metal-2 silicide portion from the substrate and, thus, this portion serves as a gate dielectric.

Figure 9:
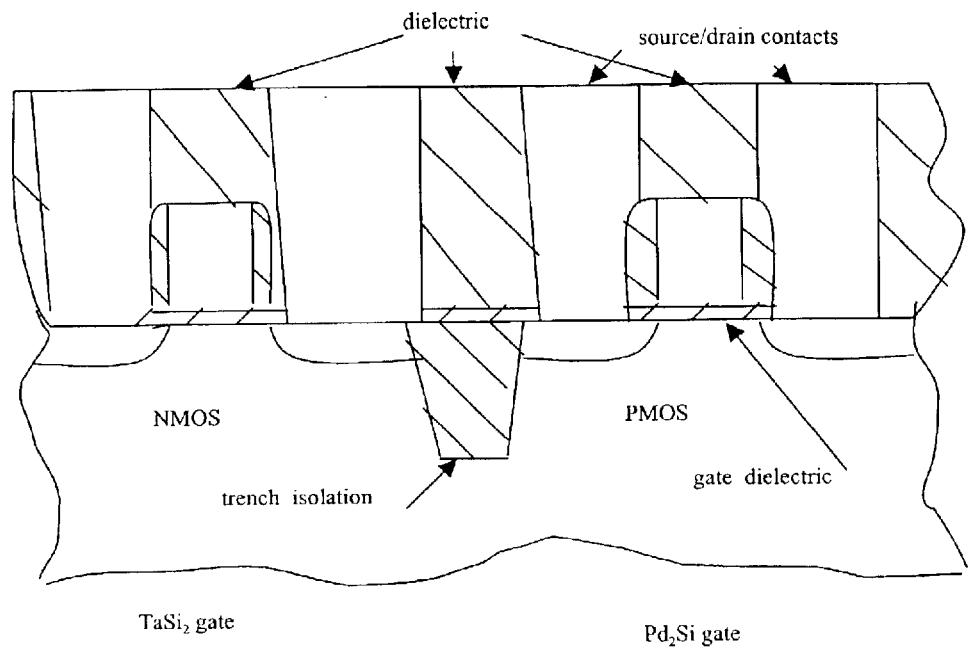

Various additional observations now may be made with respect to the resulting structure in FIG. 8. As a first observation, the two gate electrodes provide structures from which two different transistors may be formed, where the gate of each respective transistor has a different work function because each electrode includes a different material. For example, an NMOS transistor may be formed (i.e., self-aligned implants of n-type dopants to form source/drains and any source/drain extensions or pocket implants) with respect to the first gate electrode which thereby implements a gate having the work function of the metal-1 silicide, while a PMOS transistor may be formed with respect to the second gate electrode which thereby implements a gate having the work function of the metal-2 silicide. To further illustrate these aspects and as a second observation, insulating sidewall spacers may be formed with respect to the gate materials and their underlying gate insulators by blanket deposition followed by anisotropic etching; such sidewall spacers are shown in FIG. 8. Additionally, various further transistor aspects as may be implemented with respect to the gate electrodes, including but not limited to n-wells or p-wells, source/drain regions, channel implants, isolation oxides, and the like. As previously noted, some of these regions may be formed prior to the formation of the gate electrodes, such as the formation of isolation regions to later define boundaries for source/drain implants and a well of a given conductivity type such as an n-well for a PMOS transistor, while others of these regions may be formed after the formation of the gate electrodes, such as the formation of the source/drain regions. As a final observation, the preferred embodiment methodology as illustrated in FIGS. 1 through 8 demonstrates still another benefit arising with respect to the formation of the gate insulators in the gate active area. Specifically, from the above, note that the etch down to dielectric layer does not reach those portions of that layer that serve as active gate insulators. Thus, the material properties of these gate insulators are not affected by a direct exposure of these regions to the etch chemistry. Indeed, FIG. 9 illustrates subsequent structure after deposition of a premetal dielectric (PMD) and formation of contacts to source/drains.

Figure 10:
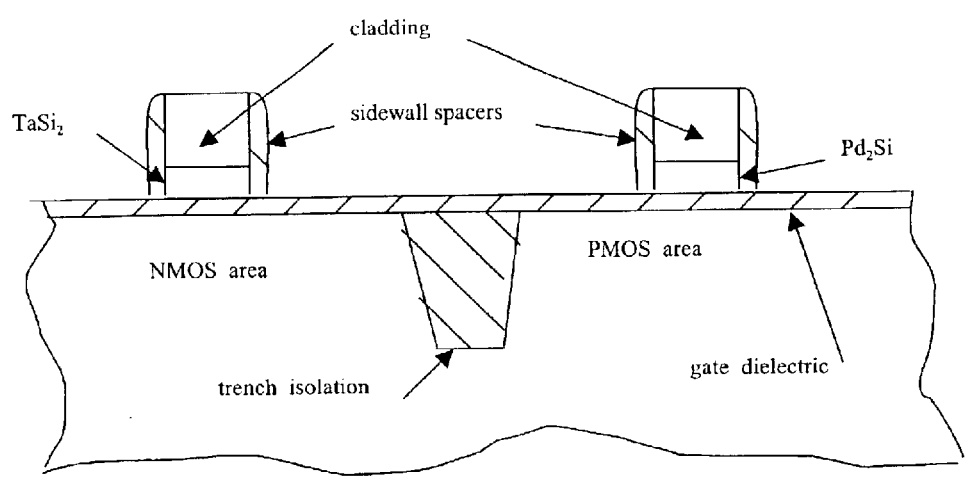
FIG. 10 illustrates a second preferred embodiment method.

FIG. 10 illustrates in cross-sectional elevation view an alternative structure which is created with analogous processing steps, and this structure shares various attributes with the previous structure of FIG. 8 in that the silicide gates determine the work functions, but the silicides may be thin and the cladding layer a metal which provides the majority of the gate thickness, or the silicide gates of the previous thickness and the cladding layer may be a dielectric which could act a a hardmask during the gate etch. In particular, for the case of thin silicide gates with metal cladding, in FIG. 2 deposit amorphous silicon to a thickness of 33 nm, and deposit Ta to a corresponding thickness, 15 nm, and pattern and silicide as in FIGS. 3–4. Then in FIG. 5 deposit Pd to a thickness of 45 nm (presuming remaining silicon thickness of 33 nm) and pattern and silicide as in FIGS. 6–7. Then prior to forming a photoresist layer and patterning to define the gates and gate-level interconnects from that layer, an additional clad layer is deposited, and then the patterned photoresist that defines the gates then formed and an etch down to the dielectric layer is performed. As a result, two gate electrodes are formed, but each gate electrode includes an additional clad layer.

The inclusion of the additional cladding layer may be used for various purposes. For example, if the approach of FIG. 8 would result in gate electrodes of an insufficient thickness, then the use of an additional metal clad layer thereby increases the height of the gate electrodes. As another example, if a lower sheet resistance is desired than that achieved by the approach of FIG. 8, then the FIG. 10 approach may be implemented where the material for the clad layer is selected to alter the sheet resistance. For example, various materials may be considered to reduce the overall sheet resistance of the gate electrodes, such as various metals, and indeed preferably refractory metals, such as tungsten, tantalum, titanium, tungsten nitride, tantalum nitride, and titanium nitride, and also others, and thickness of the cladding layer may be 50–300 nm in the preferred embodiment. Also, the cladding metal may be chosen to provide easy etching, and thus the portion of the gate etch of silicide can be minimized. In any event, once the etch to form the gate electrodes is completed, the photoresist may be removed and insulating sidewalls may be formed, as shown in FIG. 10. Lastly, various other benefits realized by the structure of FIG. 8 are also realized by the structure of FIG. 10.

From the above, it may be appreciated that the above preferred embodiments provide a set of transistor gates where one gate is formed from a metal-silicide and the other gate is formed from a different metal-silicide. In the preferred embodiment, one metal-silicide is tantalum disilicide while the other metal-silicide is palladium (II) silicide. Given these resulting structures, the preferred embodiment produces various benefits. For example, each transistor gate has a different work function, and indeed the first metal-silicide gate structure proves useful as an NMOS gate electrode while the second metal-silicide gate structure proves useful as a PMOS gate electrode. As another example, transistors may be formed using these resulting structures along with relatively thin gate dielectrics, and the overlying metal-silicide gates will not include a substantial depletion region as is the case for polysilicon gate transistors. As still another example, while tantalum and palladium have been shown as preferred metals, other metals may be used. Alternative gate electrode silicides follow from their work functions. Silicides with work functions approaching that of n+ silicon and thus useful as NMOS gate electrodes include $CrSi_2$ (work function 3.9 eV); $ZrSi_2$ (3.9 eV); and $TiSi_2$ (4.0 eV). Silicides useful for PMOS gate electrodes include PtSi (work function 5.4 eV); $Pt_2Si$ (5.6 eV); and $WSi_2$ (4.7 eV). Intermediate work functions occur in $CoSi_2$ (4.4 eV) and $MoSi_2$ (4.5 eV). As previously noted, the more reactive metal should be the first metal deposited and silicided to deter the second metal from reducing the first metal silicide during the second silicidation.

Second preferred embodiments use germanium to tune the work function. In particular, the deposition of silicon in FIG.

2 is replaced by a deposition of a silicon-germanium mixture (alloy), for example, $Si_{0.5}Ge_{0.5}$. The subsequent deposition of a metal 1 or metal 2 and annealing to drive reaction will form a metal germano silicide in the stoichiometric case for a tetravalent metal through a reaction such as:

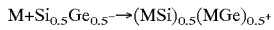

$$M+Si_{0.5}Ge_{0.5} \rightarrow (MSi)_{0.5}(MGe)_{0.5}.$$

The work function of $(MSi)_{0.5}(MGe)_{0.5}$ is roughly the linear combination of the work functions of MSi and MGe. For example, with M being Pt, the work function of the germano-silicide would be roughly 5.0 eV and useful as the PMOS gate. Similarly, with M being Co, the work function of $(CoSi_2)_{0.5}(CoGe_2)_{0.5}$ would be roughly 4.0 ev and useful as the NMOS gate. Other ratios of silicon to germanium (i.e., $Si_{1-x}Ge_x$) provide possible continuous variation in the work functions.

Modifications

The preferred embodiments may be modified in various ways. For example, the metal 2 deposited on the unsilicided silicon plus metal-1 silicide could be reacted with the unsilicided silicon without first removing the portion of metal 2 on the metal-1 silicide, and further the metal 2 on the metal-1 silicide could be retained as a cladding or could be stripped with a second-metal etch. The germanium content of the germanium-silicon cold be different for the NMOS and PMOS such as by implanting germanium (or silicon) after the metal 1 etch.

What is claimed is:

1. A method of fabrication of CMOS devices, comprising:
   (a) forming a silicon layer on a gate dielectric;
   (b) forming a first metal layer on a portion of said silicon layer;
   (c) reacting said first metal layer with said portion of said silicon layer to form a first-metal silicide;
   (d) forming a second metal layer on said silicon layer away from said portion;
   (e) reacting said second metal layer with said silicon layer to form a second-metal silicide; and
   (f) forming gates from said first-metal silicide and said second-metal silicide.

2. The method of claim 1, wherein:
   (a) said second metal layer of step (d) covers both said first metal silicide and said silicon layer away from said portion.

3. The method of claim 1, wherein:
   (a) said first metal is tantalum; and
   (b) said second metal is palladium.

4. The method of claim 1, wherein
   (a) said second metal silicide has a heat of formatin less than that of said than said first metal silicide.

5. A method of fabrication of CMOS devices, comprising:
   (a) forming a silicon-germanium layer on a gate dielectric;
   (b) forming a first metal layer on a portion of said silicon-germanium layer;
   (c) reacting said first metal layer with said portion of said silicon-germanium layer to form a first-metal germano-silicide;
   (d) forming a second metal layer on said silicon-germanium layer away from said portion;
   (e) reacting said second metal layer with said silicon-germanium layer to form a second-metal germano-silicide; and
   (f) forming gates from said first-metal germano-silicide and said second-metal germano-silicide.

* * * * *